United States Patent
Inoue et al.

(10) Patent No.: US 7,456,889 B2
(45) Date of Patent: Nov. 25, 2008

(54) SOLID-STATE IMAGING DEVICE WITH GATE CONTACTS OVERLAPPING BOTH AN ISOLATION REGION AND AN ACTIVE REGION

(75) Inventors: Ikuko Inoue, Yokohama (JP); Hiroshige Goto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 551 days.

(21) Appl. No.: 11/251,825

(22) Filed: Oct. 18, 2005

(65) Prior Publication Data

US 2006/0082668 A1     Apr. 20, 2006

(30) Foreign Application Priority Data

Oct. 19, 2004   (JP)   ............... 2004-304484

(51) Int. Cl.
*H04N 3/14* (2006.01)
*H04N 5/335* (2006.01)
*H01L 27/00* (2006.01)
*H01L 31/062* (2006.01)
*H01L 31/113* (2006.01)

(52) U.S. Cl. ............ 348/308; 250/208.1; 257/291

(58) Field of Classification Search ......... 348/302, 348/308; 250/208.1; 257/291, 292, 293
See application file for complete search history.

(56) References Cited

U.S. PATENT DOCUMENTS

| | | | |
|---|---|---|---|
| 7,030,357 B2* | 4/2006 | Lee | 250/208.1 |
| 7,364,960 B2* | 4/2008 | Lyu | 438/204 |
| 2005/0088556 A1* | 4/2005 | Han | 348/308 |
| 2005/0237405 A1* | 10/2005 | Ohkawa | 348/308 |
| 2005/0263764 A1* | 12/2005 | Kim et al. | 257/69 |
| 2006/0081887 A1* | 4/2006 | Lyu | 257/215 |
| 2006/0084195 A1* | 4/2006 | Lyu | 438/48 |
| 2006/0132633 A1* | 6/2006 | Nam et al. | 348/308 |
| 2006/0192261 A1* | 8/2006 | Sze et al. | 257/431 |
| 2008/0157143 A1* | 7/2008 | Lim | 257/292 |

FOREIGN PATENT DOCUMENTS

| JP | 11330461 A | * 11/1999 |
|---|---|---|
| JP | 2000-150848 | 5/2000 |
| JP | 2006054430 A | * 2/2006 |
| KR | 2005060650 A | * 6/2005 |

* cited by examiner

*Primary Examiner*—John M Villecco
(74) *Attorney, Agent, or Firm*—Oblon, Spivak, McClelland, Maier & Neustadt, P.C.

(57) ABSTRACT

A solid-state imaging device has an imaging region in which unit cells, each of which includes a photoelectric conversion section and a signal scanning circuit section, are disposed on a semiconductor substrate in a two-dimensional manner. The signal scanning circuit section is composed of a plurality of transistors. At least part of a gate contact of each transistor in the signal scanning circuit section is formed on an active region of each transistor.

20 Claims, 9 Drawing Sheets

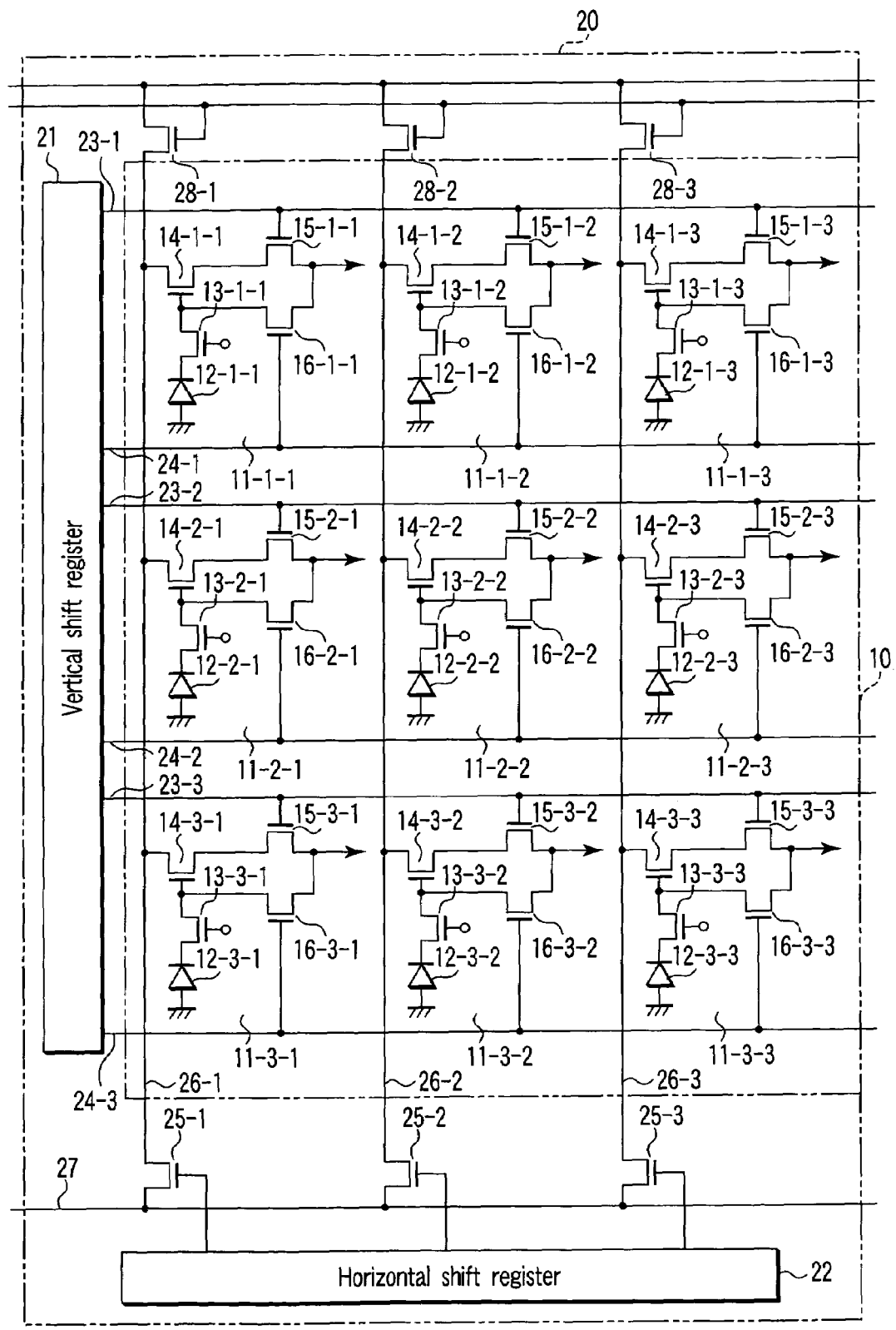
F I G. 1

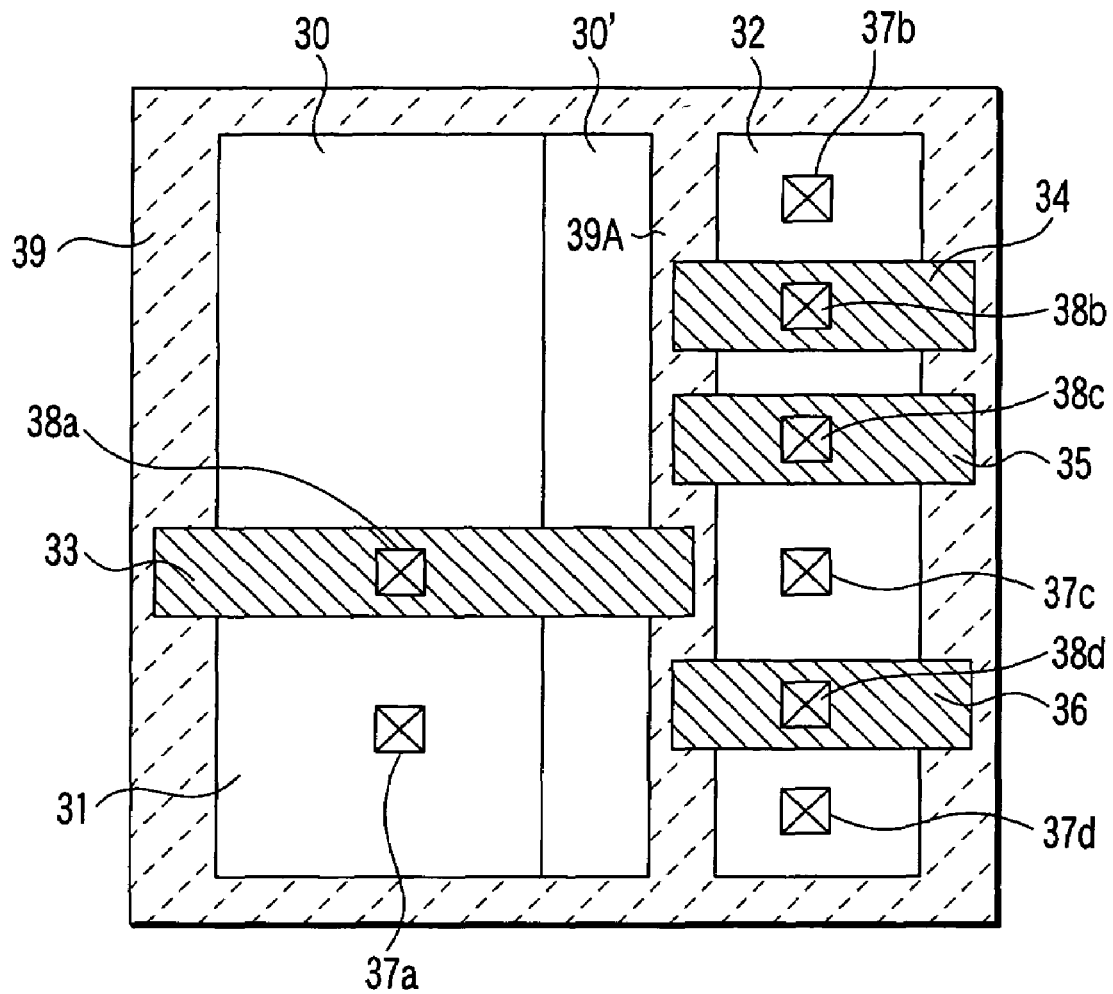
F I G. 2

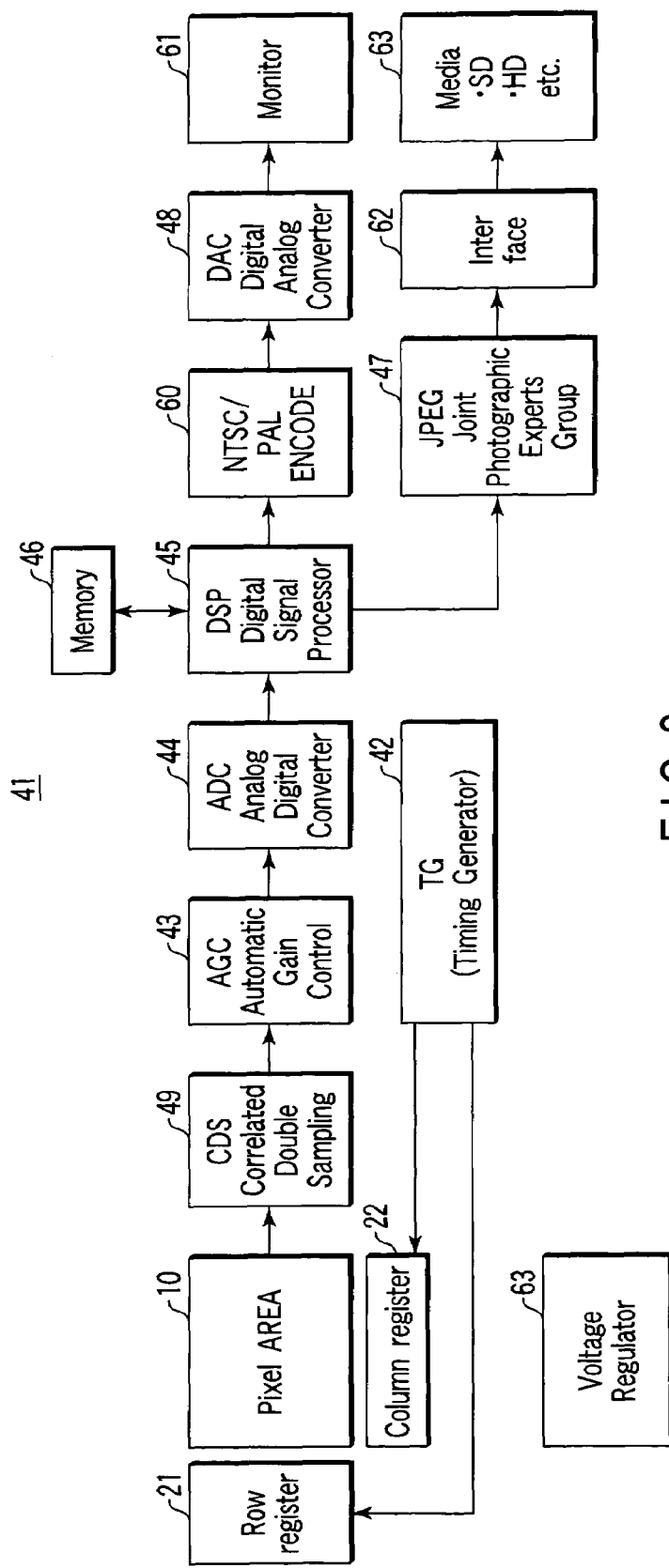
F I G. 9

SOLID-STATE IMAGING DEVICE WITH GATE CONTACTS OVERLAPPING BOTH AN ISOLATION REGION AND AN ACTIVE REGION

CROSS-REFERENCE TO RELATED APPLICATIONS

This application is based upon and claims the benefit of priority from prior Japanese Patent Application No. 2004-304484, filed on Oct. 19, 2004, the entire contents of which are incorporated herein by reference.

BACKGROUND OF THE INVENTION

1. Field of the Invention

The present invention relates to a MOS type solid-state imaging device. In particular, the present invention relates to a solid-state imaging device using an amplification type MOS sensor.

2. Description of the Related Art

In recent years, a MOS type solid-state imaging device using an amplification type MOS sensor has been practically utilized as one of solid-state imaging devices. This solid-state imaging device amplifies a signal detected by a photo diode on a cell by cell basis by means of a MOS transistor, and is featured by high sensitivity.

A configuration of cells (pixels) of the MOS type solid-state imaging device is made of: a photo diode for photoelectric conversion; a readout transistor for reading out a signal; an amplifier transistor for amplifying a signal; a vertical selector transistor for selecting a readout line; and a reset transistor for resetting a signal charge or the like. In addition, a source of the amplifier transistor is connected to a vertical signal line so that a signal outputted to the vertical signal line is outputted to a horizontal signal line via a vertical selector transistor (refer to Jpn. Pat. Appln. KOKAI Publication No. 2000-150848, for example).

In the meantime, in the solid-state imaging device of this type, four transistors, i.e., a readout transistor, an amplifier transistor, a vertical selector transistor, and a reset transistor are included in one pixel. Thus, if the pixel is reduced in size for the purpose of achieving multiple pixels, an area of a photo diode is reduced in size. Thus, there has been a problem that a saturation signal having pixel features decreases, and optical shot noise becomes high.

This problem will be described with reference to a plan view of one pixel in a conventional MOS type solid-state imaging device shown in FIG. 10. In FIG. 10, reference numeral 50 denotes a photo diode; reference numeral 51 denotes a signal detector section; reference numeral 52 denotes a signal scanning circuit region; reference numeral 53 denotes a gate of a readout transistor; reference numeral 54 denotes a gate of an amplifier transistor; reference numeral 55 denotes a gate of a vertical selector transistor; reference numeral 56 denotes a gate of a reset transistor; reference numeral 57 denotes a source drain contact; reference numeral 58 denotes a contact on a gate; reference numeral 59 denotes an element isolating region. Wiring connections are not shown because they include a variety of combinations.

As shown in FIG. 10, in a conventional pixel, all of the contacts to gates 53, 54, 55, and 56 of each transistor have been obtained on the element isolating region 59. This is a process rule which is similar to a logic. That is, in the logic process, when a contact is disposed on an active region of a transistor, "gm" and a current drive capability are degraded. Thus, it is believed to be undesirable to form a contact on an active region of a transistor. It is general to employ such a configuration in an element other than a logic.

As described above, in the conventional MOS type solid-state imaging device, a gate contact of a transistor of a signal scanning circuit section is obtained on an element isolating region so that an area of the element isolating region cannot be reduced in size so much. As a result, there has been a problem that a photo diode area, in particular, a light receiver area is reduced in size, and optical shot noise becomes high.

BRIEF SUMMARY OF THE INVENTION

A solid-state imaging device according to one aspect of the present invention has an imaging region in which unit cells each including a photoelectric conversion section and a signal scanning circuit section on a semiconductor substrate are disposed in a two-dimensional manner, the signal scanning circuit section being composed of a plurality of transistors, wherein at least part of the gate contact of each transistor of the signal scanning circuit section is formed on an active region of such each transistor.

BRIEF DESCRIPTION OF THE SEVERAL VIEWS OF THE DRAWING

FIG. 1 is a view showing a circuit construction of a pixel section in a MOS type solid-state imaging device according to a first embodiment;

FIG. 2 is a plan view showing a single pixel configuration of the MOS type solid-state imaging device according to the first embodiment;

FIG. 9 is a signal diagram adopted to explain an operation of the system LSI chip in FIG. 8;

DETAILED DESCRIPTION OF THE INVENTION

Figure 3:
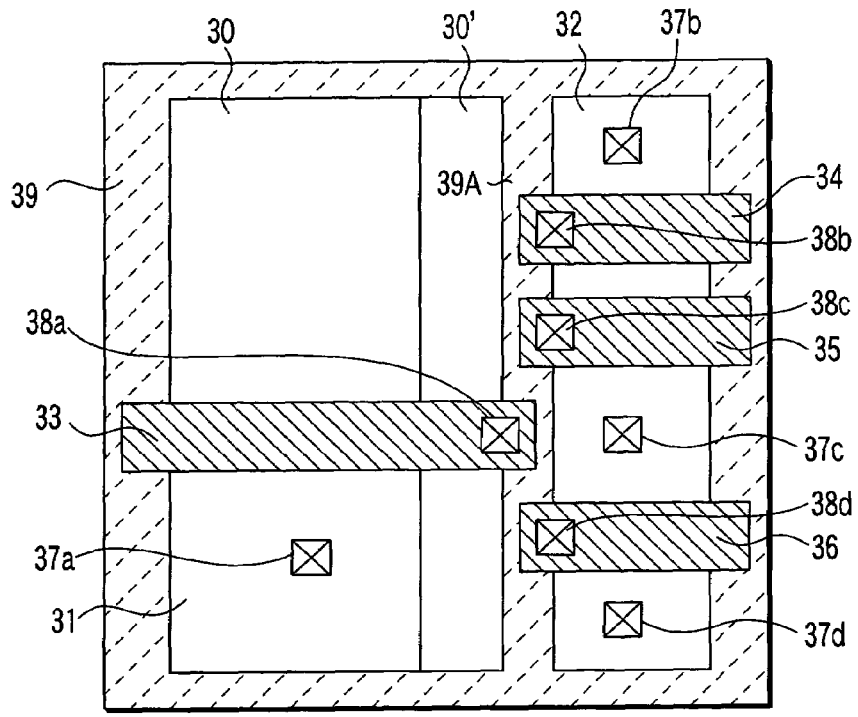
FIG. 3 is a plan view showing a single pixel configuration of the MOS type solid-state imaging device according to a second embodiment.

Hereinafter, embodiments of the present invention will be described with reference to the accompanying drawings.

FIRST EMBODIMENT

FIG. 1 is a circuit diagram depicting a MOS type solid-state imaging device according to a first embodiment of the present invention.

In an imaging region 10, unit pixels 3×3 are arranged in a two-dimensional manner, each of which is made of: a photo diode 12 (12-1-1, 12-1-2, . . . , 12-3-3) for photoelectric conversion; a readout transistor 13 (13-1-1, 13-1-2, . . . , 13-3-3) for reading out a signal of the photo diode 12; an amplifier transistor 14 (14-1-1, 14-1-3, . . . , 14-3-3) for amplifying the read out a signal; a vertical selector transistors 15 (15-1-1, 15-1-2, . . . , 15-3-3) for selecting a line for reading out a signal; and a reset transistor 16 (16-1-1, 16-1-2, . . . , 16-3-3) for resetting a signal charge. In the figure, although the 3×3 pixels have been introduced for the purpose of clarity, in actuality, many more unit pixels are arranged in a two-dimensional manner. For example, in a solid-state imaging device used for a digital still camera, a device having several mega-pixels is manufactured.

In addition, a pixel for determining a signal level at a dark time (hereinafter, referred to as an OB pixel) is disposed at an end portion of the imaging region 10, although not shown. The OB pixel is configured in the same manner as an intrinsic pixel, and is composed of a photo diode 12', a readout transistor 13', an amplifier transistor 14', a vertical selector transistor 15', and a reset transistor 16'.

A horizontal address line 23 (23-1, 23-2, 23-3) wired from a vertical shift resistor 21 in a horizontal direction is connected to a gate of the corresponding vertical selector transistor 15, determining a line for reading out a signal. A reset line 24 (24-1, 24-2, 24-3) is wire-connected to a gate of the corresponding reset transistor 16.

A source of the amplifier transistor 14 is connected to a vertical signal line 26 (26-1, 26-2, 26-2), and a load transistor 28 (28-1, 28-2, 28-3) is provided at one end of the vertical signal line 26. The other end of the vertical signal line 26 is connected to a horizontal signal line 27 via a horizontal selector transistor 25 (25-1, 25-2, 25-3) selected by a selector pulse supplied from a horizontal shift resistor 22.

Figure 10:
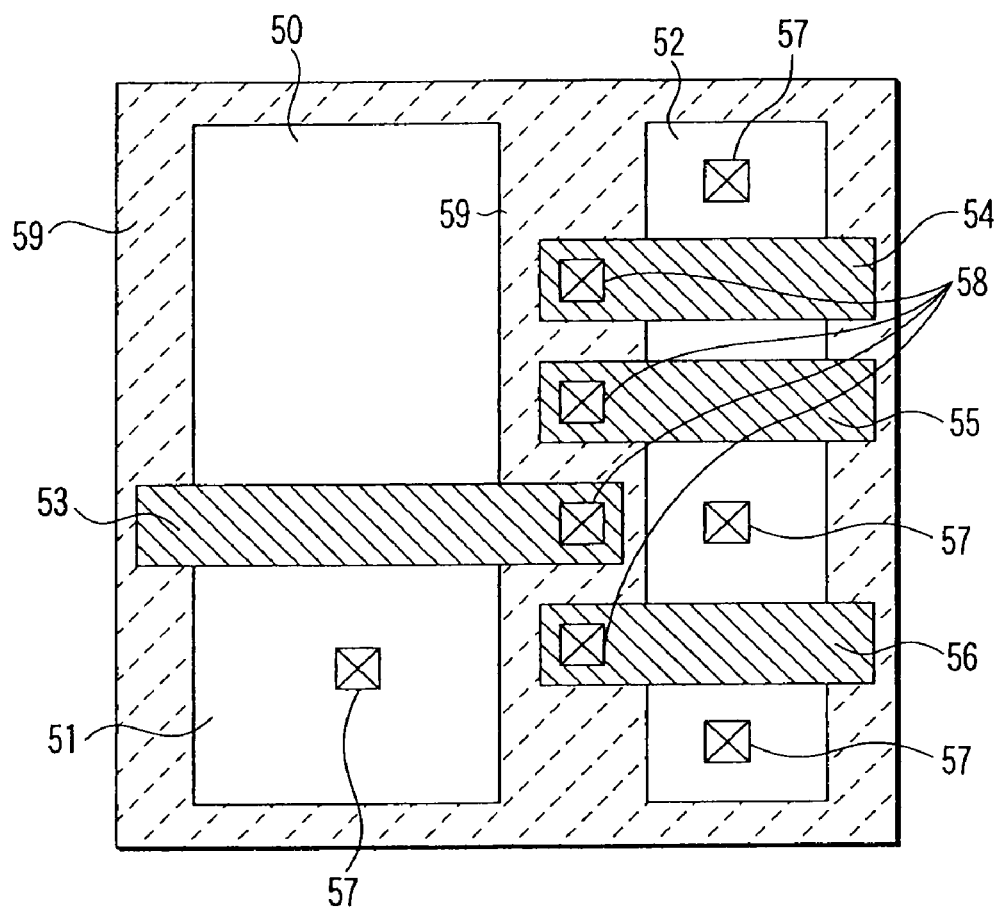
FIG. 10 is a plan view showing a single pixel configuration of a conventional MOS type solid-state imaging device.

In FIG. 10, the block designated by reference numeral 10 is an imaging region (pixel region), and reference numeral 20 denotes a peripheral circuit such as a register for scanning the imaging region 10. In addition, reference numeral 11 (11-1-1, 11-1-2, 11-3-3) denotes a unit pixel.

The above circuit-like basic configuration is similar to that of a conventional device. The device according to the present embodiment is different from the conventional device in element structure shown below, in particular, in gate contact position.

FIG. 2 is a view showing a planar structure of a single pixel in accordance with the present embodiment. In FIG. 2, reference numerals 30, 30' denote an active region of a photo diode which corresponds to reference numeral 12 in FIG. 1; reference numeral 31 denotes an active region of a transistor of a signal detector section; reference numeral 32 denotes an active region of a transistor of a signal scanning circuit; reference numeral 33 denotes a gate of a signal readout transistor which corresponds to reference numeral 13 in FIG. 1; reference numeral 34 denotes a gate of an amplifier transistor which corresponds to reference numeral 14 in FIG. 1; reference numeral 35 denotes a gate of an address transistor which corresponds to reference numeral 15 in FIG. 1; reference numeral 36 denotes a gate of a reset transistor which corresponds to reference numeral 16 in FIG. 1; reference numerals 37a to 37d each denote a source drain contact; reference numerals 38a to 38d each denote a contact on a gate; and reference numeral 39 denotes an element isolating region formed around each of the active regions 30, 30', 31, and 32. Wiring connections are not shown because they has a variety of combinations.

The device according to the present embodiment is different from the conventional device in terms of the contact positions of gates 33, 34, 35, and 36 of each transistor in the active region 32 for a transistor of a signal scanning circuit. That is, in the conventional pixel of FIG. 10, a gate contact 58 has been formed on an element isolating region 59 formed between active regions 50, 51 and an active region 52. However, in the present embodiment, all of the gate contacts 38a to 38d are formed on the active region 32 of a transistor. Thus, in particular, there is no need to provide a margin for a gate contact in an element isolating region 39A between the active regions 30, 30' and the region 32; a width of the element isolating region 39A can be reduced in size; and an area of the photo diode 30 can be expanded by the illustrated 30' region.

As described above, according to the present embodiment, the gate contact of each transistor in the active region 32 of the signal scanning circuit is formed on a transistor active region, whereby the width of the element isolating region 39A is reduced in size, and an area of the photo diode 30 can be expanded. Therefore, even if a pixel is downsized for the purpose of achieving multiple pixels, it is possible to increase a saturation signal more significantly in accordance with a logic process rule of the same generation. In this manner, optical shot noise is reduced in magnitude, and a good quality image can be obtained.

A gate contact is formed on the transistor active region, and thus, there occurs slight degradation of "gm" or current drive capability of a transistor. However, a photoelectric conversion section of the MOS type solid-state imaging device as in the present embodiment makes an analog operation, and thus, this section does not cause a large malfunction such as logic fluctuation in logic element, and degradation of "gm" or current drive capability is hardly problematic. Even if degradation of "gm" or current drive capability has occurred, advantageous effect caused by an increase in photo diode area becomes much efficient.

SECOND EMBODIMENT

FIG. 3 is a plan view showing a single pixel configuration of a MOS type solid-state imaging device according to a second embodiment of the present invention. The same constituent elements in FIG. 2 are designated by the same reference numerals. A detailed description is omitted here.

The present embodiment is different from the first embodiment described previously in that all gate contacts 38a to 38d have been formed across a boundary section between active regions 30', 32 and an element isolating region 39, respectively. Even with such a configuration, the width of an element isolating region 39A between the regions 30' and 32 is reduced, whereby an area of the element isolating region can be reduced, and advantageous effect similar to that according to the first embodiment can be attained.

THIRD EMBODIMENT

Figure 4:
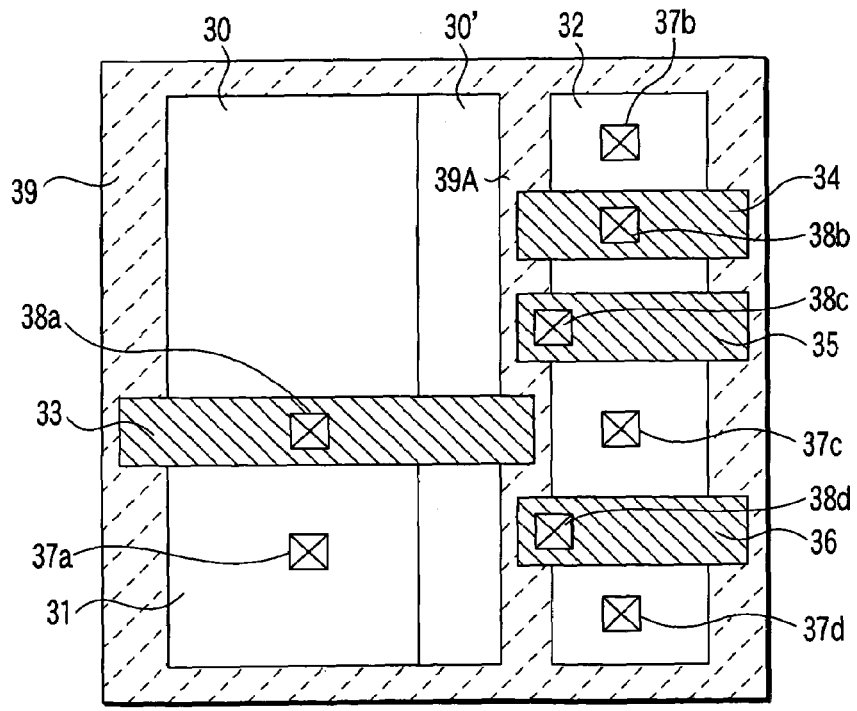
FIG. 4 is a plan view showing a single pixel configuration of the MOS type solid-state imaging device according to a third embodiment.

FIG. 4 is a plan view showing a single pixel configuration of a MOS type solid-state imaging device according to a third embodiment of the present invention. The same constituent elements in FIG. 2 are designated by the same reference numerals. A detailed description is omitted here.

The present embodiment is different from the first embodiment described previously in that two gate contacts 38a, 38b are formed to be completely moved onto active regions 30, 32, and remaining two gate contacts 38c, 38d are formed across the boundary section between the active region 32 and an element isolating region 39A.

With such a configuration, the area of the element isolating region 39A can be reduced, and advantageous effect similar to that according to the first embodiment can be attained. In addition, in the present embodiment, the gate contact is partially formed at the boundary section between the active region and the element isolating region as well as on the active region of the transistor, thereby making it possible to increase the degree of freedom in wiring.

As has been described above, according to the embodiments of the present embodiment, the gate contact of the transistor of the signal scanning circuit section is formed on the active region of the transistor, whereby there is no need for providing a margin for the gate contact in the element isolating region. Thus, the element isolating region can be reduced in size, and the photo diode area can be expanded. In this manner, even with a fine pixel, good saturation characteristics can be obtained, and optical shot noise can be reduced.

Here, there persists a problem that "gm" and current drive capability are degraded by forming a contact on an active region of a transistor. However, in the case of the solid-state imaging device of this type, unlike a general logic element, degradation of "gm" and current drive capability is hardly problematic, and an increase in photo diode area is much more efficient than such degradation.

The present invention is not limited to each of the above described embodiments. In the present embodiment, the signal scanning circuit section consisting of the readout transistor, the amplifier transistor, the selector transistor, and the reset transistor in addition to the photo diode (photoelectric conversion section) has been used as a configuration of unit cells. However, a configuration of the signal scanning circuit section is not limited to that shown in FIG. 1, and can be properly changed according to the specification. The signal scanning circuit section may have an amplifier transistor for amplifying a signal obtained by being converted by the photoelectric conversion section and a reset transistor for resetting a signal, and other transistors may be used as required.

Figure 5A:
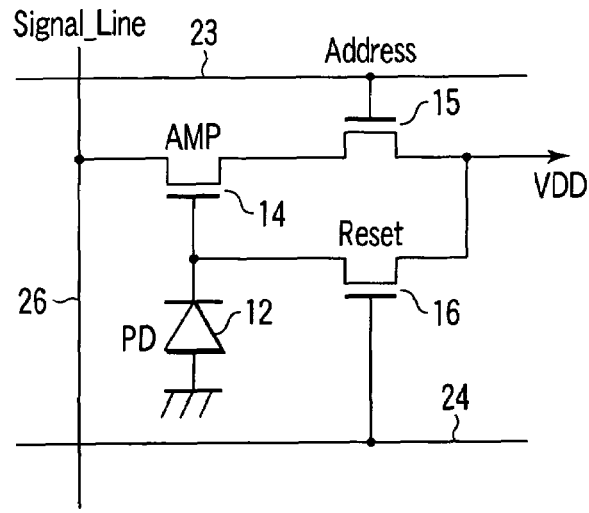
FIG. 5A is a view showing a circuit configuration for one pixel of a pixel section in a MOS type solid-state imaging device according to a fourth embodiment.

FIG. 5A is a circuit diagram depicting a single pixel circuit configuration of a solid-state imaging device according to another embodiment. In the present embodiment, there is provided a 3-transistor/1-cell configuration which does not use the readout transistor 13 of the four transistors in the embodiment of FIG. 1. Other constituent elements are identical to those shown in FIG. 1. The same constituent elements are designated by the reference numerals, and a duplicate description is omitted here. In FIG. 5A, when a pixel signal generated in response to image light incident to a photo diode 12 is amplified after being supplied to a gate of an amplifier transistor 14. If a vertical selector transistor 15 is selected by means of a horizontal address line 23, the amplified pixel signal is outputted to a signal line 26.

Figure 5B:
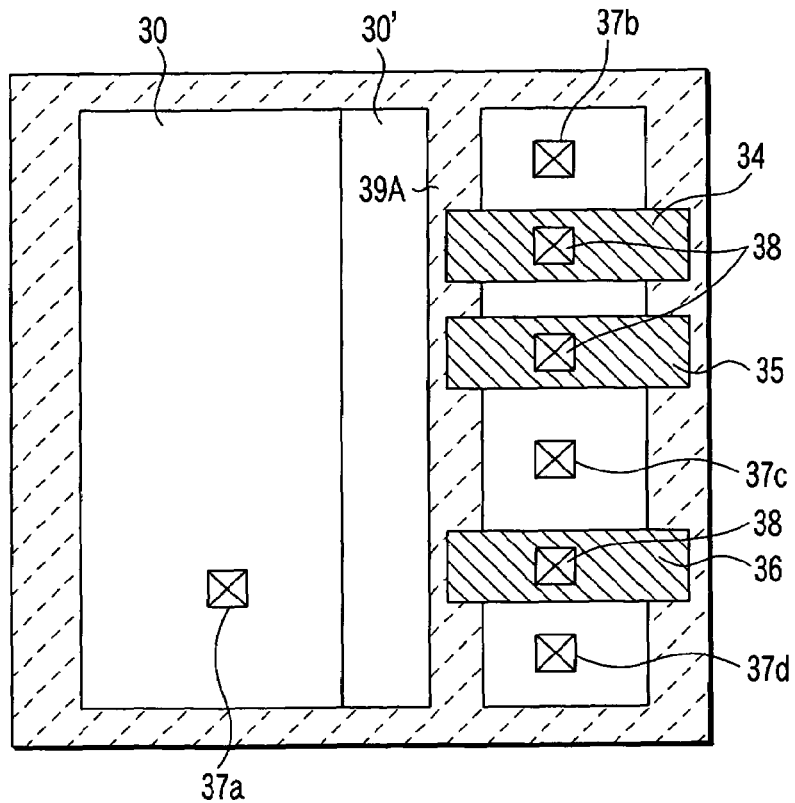
FIG. 5B is a plan view showing a single pixel configuration according to the embodiment of FIG. 5A.

A planar configuration of a pixel having this circuit configuration of FIG. 5A is as shown in FIG. 5B. As has been described above, in the present embodiment, a readout transistor connected to the photo diode 12 is not shown, and thus, a gate 33 of the readout transistor and its gate contact 38a in the configuration of FIG. 2 are not formed in the configuration shown in FIG. 5B. Thus, a light receiving area of the photo diode 12 in the active regions 30, 30' increases concurrently.

Figure 6A:
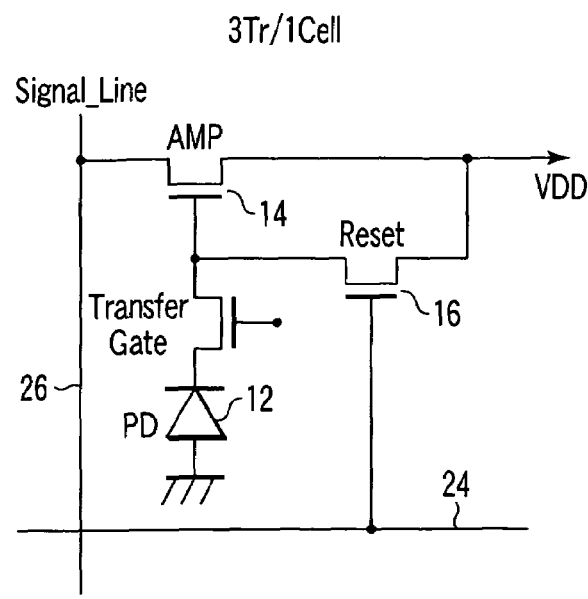
FIG. 6A is a view showing a circuit configuration for one pixel of a pixel section in a MOS type solid-state imaging device according to a fifth embodiment.

FIG. 6A is a circuit diagram depicting a single pixel circuit configuration of a solid-state imaging device according to still another embodiment. In the present embodiment, there is provided a 3-transistor/1-cell configuration which does not use a vertical selector transistor 15 of the four transistors in the embodiment of FIG. 1. Other constituent elements are identical to those shown in FIG. 1. The same constituent elements are designated by the same reference numerals. A duplicate description is omitted here. In FIG. 6A, the pixel signal generated in response to the image light incident to the photo diode 12 is amplified after being supplied to the gate of the amplifier transistor 14 via the readout transistor 13. In this case, a vertical selector transistor connected to a horizontal address line is not shown. Thus, selector pulse signals with their different timings are sequentially supplied to a VDD terminal connected to the amplifier transistor 14, a signal line 26 is selected, and the amplified pixel signal is outputted to the signal line 26.

Figure 6B:
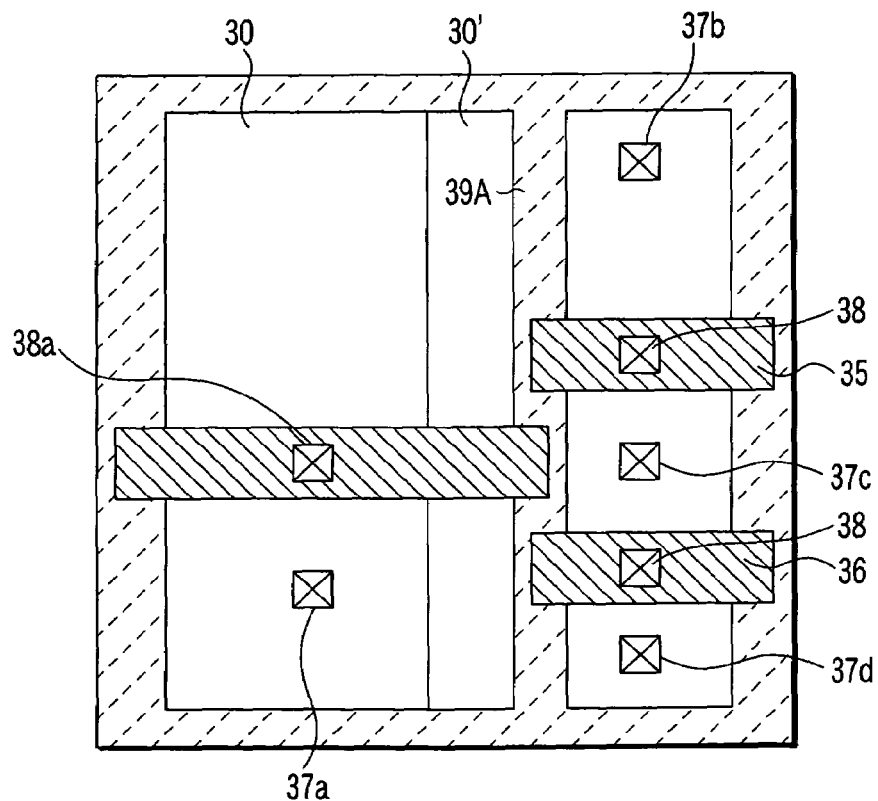
FIG. 6B is a plan view showing a single pixel configuration according to an embodiment of FIG. 6A.

A planer configuration of pixels each having this circuit configuration in FIG. 6A is as shown in FIG. 6B. As has been described above, in the present embodiment, the vertical selector transistor connected to the horizontal address line is not shown, and thus, the gate 34 of the vertical selector transistor and its gate contact 38b in the configuration of FIG. 2 are not formed in the configuration shown in FIG. 6B. Therefore, the gate 34 of one of the gates 34 and 35 of the transistors adjacent to each other in FIG. 5B is not shown, and a circuit pattern of the signal scanning circuit section is simplified.

Figure 7A:
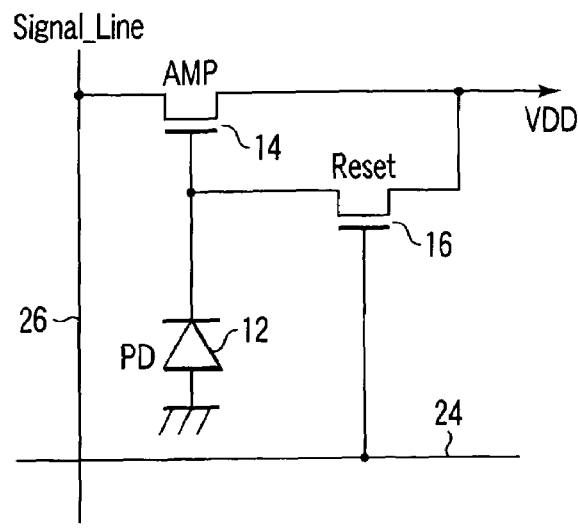
FIG. 7A is a view showing a circuit configuration for one pixel of a pixel section in a MOS type solid-state imaging device according to a sixth embodiment.

FIG. 7A is a circuit diagram depicting a single pixel circuit configuration of a solid-state imaging device according to still another embodiment. In the present embodiment, there is provided a 2-transistor/1-cell configuration which does not use a readout transistor 13 and a vertical selector transistor 15 of the four transistors in the embodiment of FIG. 1. Other constituent elements are identical to those shown in FIG. 1. The same constituent elements are designated by the same reference numerals. A duplicate description is omitted here. In FIG. 7A, the pixel signal generated in response to the image light incident to the photo diode 12 is amplified after being supplied to the gate of the amplifier transistor 14 without interposing the readout transistor. In this case, like the circuit of FIG. 6A, the vertical selector transistor connected to the horizontal address line is not shown. Thus, the selector pulse signals with their different timings are sequentially supplied to the VDD terminal connected to the amplifier transistor 14, the signal line 26 is selected, and the amplified pixel signal is outputted to the signal line 26.

Figure 7B:
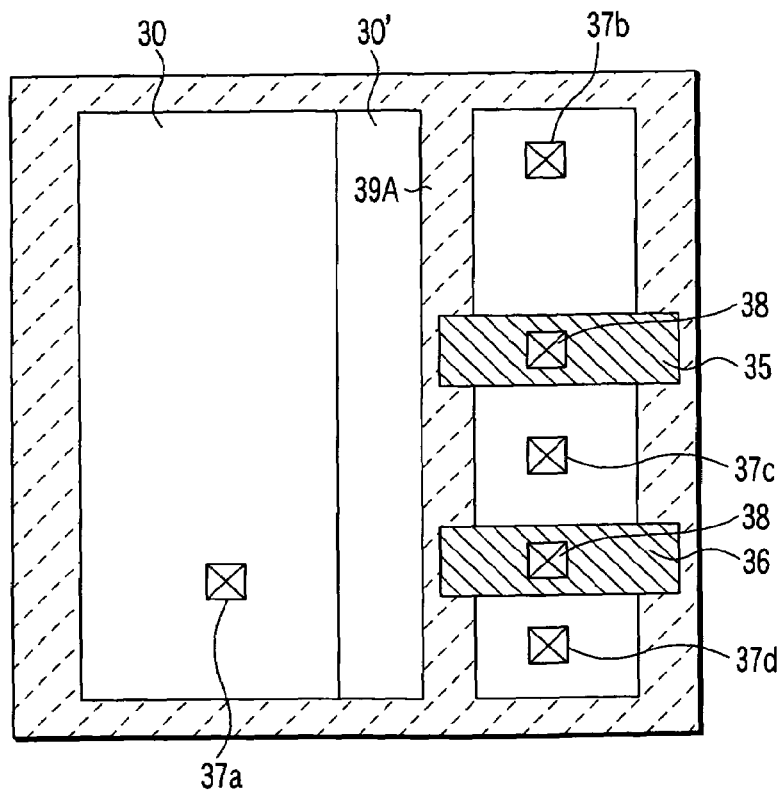
FIG. 7B is a plan view showing a single pixel configuration according to the embodiment of FIG. 7A.

A planer configuration of pixels each having this circuit configuration in FIG. 7A is as shown in FIG. 7B. As has been described above, in the present embodiment, a readout transistor is not shown, and thus, the gate 33 of the readout transistor and its gate contact 38a in the configuration of FIG. 2 are not formed in the configuration shown in FIG. 7B. Therefore, like the embodiment in FIG. 5B, a light receiving area in the photo diode active regions 30, 30' increases.

Figure 8:
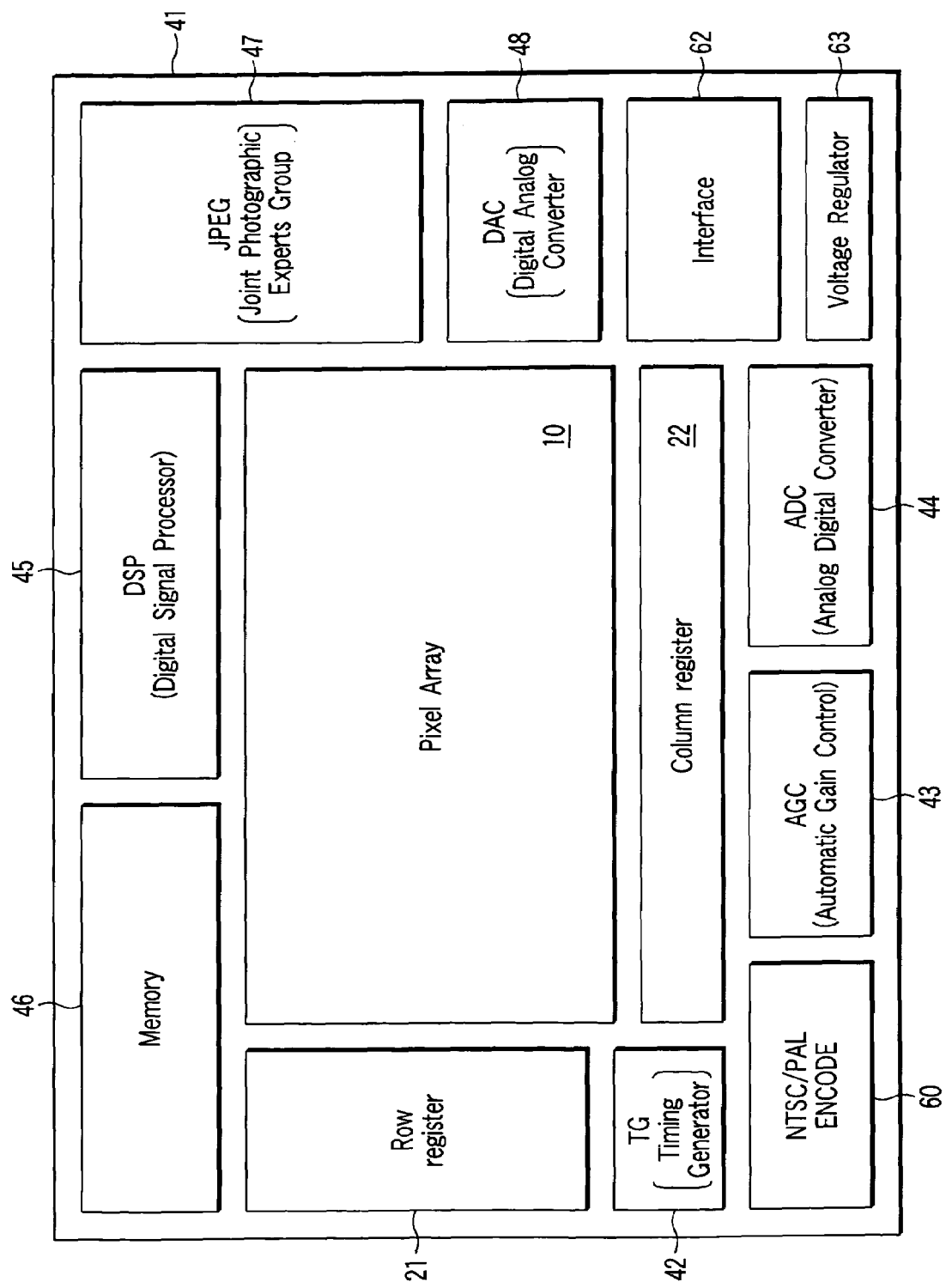
FIG. 8 is a block diagram depicting an internal configuration of a system LSI chip having incorporated therein a MOS type solid-state imaging device configured by applying the present invention.

FIG. 8 is a layout view showing a whole configuration of an LSI including a pixel array 10 shown in FIG. 1 and the signal scanning circuit section formed around the array, the LSI being formed on one chip. In FIG. 8, on a chip 41, the pixel array 10 is disposed at its center portion, and a timing generator 43 for controlling a row direction register 21 and a column direction register 22 is disposed around this array. Further, around the pixel array 10, there are disposed: an Automatic Gate Control (AGC) circuit 43; an Analog-Digital Conversion (ADC) circuit 44; a Digital Signal Processor (DSP) circuit 45; a memory 46; a Joint Photographic Experts Group (JPEG) circuit 47; and a Digital-Analog Conversion (DAC) circuit 48 or the like.

Now, an operation of a system LSI applied to a digital still camera in FIG. 8 will be described here. The pixel array 10 has a pixel configuration called a 4-transistor/1-cell configuration configured in the same way as the imaging device 10 of FIG. 1, for example. When image light is incident to the pixel array 10 during a camera imaging mode, the image signals are sequentially read out on a pixel by pixel basis in a row and column direction by means of outputs of column registers 21, 22. The read out signals are sampled by means of a Correlated Double Sampling (CDS) circuit 49. The sampled analog image signal is level-adjusted by means of the AGC circuit 43, the level-adjusted image signal is supplied to the ADC circuit 44, and the supplied signal is converted to a digital image signal. This digital image signal is stored as image data in the memory 46 under the control of the DSP circuit 45. This stored image data is encoded by means of an encoder 60 in accordance with an NTSC or PAL image display scheme. The encoded image data is converted to an analog signal by the DAC circuit 48, and then, an image is reproduced on a monitor 61. On the other hand, in order to record the image data picked up by means of the camera in a predetermined medium such as SD or HD, the image data stored in the memory 46 is read out by means of the DSP 45, the read out image data is sent to the JPEG circuit 47, and an image data compressing operation is carried out. The compressed image data is sent to a predetermined medium 63, for example, SD, via an interface 62, and the sent data is recorded therein.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A MOS type solid-state imaging device comprising an imaging region in which a plurality of unit cells, each of which includes a photoelectric conversion section and a signal scanning circuit section, are disposed on a semiconductor substrate in a two-dimensional manner, the each unit cell having an active region in which the photoelectric conversion section and the signal scanning circuit section are formed and an element isolating region formed adjacent to the active region, the signal scanning circuit section being composed of a plurality of MOS transistors,
    wherein the plurality of MOS transistors of the signal scanning circuit section include at least a MOS transistor having a gate contact which overlaps both of the element isolating region and the active region adjacent thereto.

2. The solid-state imaging device according to claim 1, wherein at least one MOS transistor having a gate contact which fully overlaps the active region is included in the plurality of MOS transistors.

3. The solid-state imaging device according to claim 1, wherein the plurality of MOS transistors configure a signal scanning circuit section which further includes at least an amplifier transistor which amplifies a video image signal obtained after converted by the photoelectric conversion section and a reset transistor which resets the video image signal.

4. The solid-state imaging device according to claim 3, wherein the signal scanning circuit section further includes a readout transistor which reads out a video image signal obtained after converted by the photoelectric conversion section and a selector transistor which selects the amplified video image signal to be outputted to a signal line.

5. The solid-state imaging device according to claim 1, wherein the signal scanning circuit section includes an amplifier transistor which amplifies the image signal obtained after converted by the photoelectric conversion section, a selector transistor which selects the amplified image signal to be outputted to a signal line, and a reset transistor which resets the image signal.

6. The solid-state imaging device according to claim 5, wherein the amplifier transistor, the selector transistor, and the reset transistor have a gate contact which is overlapped in the second active region.

7. The solid-state imaging device according to claim 1, wherein the signal scanning circuit section includes a readout transistor which reads out the image signal obtained after converted by the photoelectric conversion section, an amplifier transistor which amplifies the image signal, and a reset transistor which resets the image signal.

8. The solid-state imaging device according to claim 7, wherein the readout transistor has a gate contact which is overlapped in the first active region, and the amplifier transistor and reset transistor have a gate contact which is overlapped in the second active region.

9. The solid-state imaging device according to claim 1, wherein the signal scanning circuit section includes an amplifier transistor which amplifies the image signal obtained after converted by the photoelectric conversion section and a reset transistor which resets the image signal.

10. The solid-state imaging device according to claim 9, wherein the amplifier transistor and the reset transistor have a gate contact which is overlapped in the second active region.

11. A MOS type solid-state imaging device comprising an imaging region in which a plurality of unit cells, each of which includes a photoelectric conversion section and a signal scanning circuit section, are disposed on a semiconductor substrate in a two-dimensional manner, the each unit cell having a first active region in which the photoelectric conversion section is formed, a second active region in which the signal scanning circuit section is formed, and an element isolating region formed between the first and second active regions, the signal scanning circuit section being composed of a plurality of MOS transistors,
    wherein the plurality of MOS transistors of the signal scanning circuit section includes a first MOS transistor having a gate contact which overlaps both of the element isolating region and a first active region adjacent thereto and a second MOS transistor having a gate contact which overlaps both of the element isolating region and a second active region adjacent thereto.

12. The solid-state imaging device according to claim 11, wherein the first MOS transistor has a gate contact which fully overlaps the first active region and the second MOS transistor has a gate contact which fully overlaps the second active region.

13. The solid-state imaging device according to claim 11, wherein the second active region includes: the second MOS transistor formed as an amplifier transistor which amplifies an image signal obtained after converted by the photoelectric conversion section in order to configure the signal scanning circuit section; and a third MOS transistor formed as a reset transistor which resets the image signal.

14. The solid-state imaging device according to claim 13, wherein the signal scanning circuit section further includes a readout transistor which reads out the image signal obtained after converted by the photoelectric conversion section and a selector transistor which selects the amplified image signal to be outputted to a signal line; the readout transistor is formed in the first active region as the first MOS transistor; and the selector transistor is formed in the second active region as a fourth MOS transistor.

15. The solid-state imaging device according to claim 14, wherein the second to fourth MOS transistors each have a gate contact formed to be fully overlapped in the second active region.

16. The solid-state imaging device according to claim 15, wherein the first MOS transistor has a gate contact formed to be fully overlapped in the first active region.

17. An LSI circuit system having integrated as one chip: a pixel array configured by arranging a plurality of pixel cells which form an image signal in response to an optical image made incident to a photoelectric conversion section; an internal storage section which stores the image signal formed by this pixel array as image data under the control of a data processor section; an image reproducing section which sends the image data stored in the internal storage section in order to reproduce the image data as a visible image; and an image data processor section which compresses the image data stored in the internal storage section and stores the compressed image data in a detachable external data storage device, wherein the pixel array is disposed in a two-dimensional manner as a plurality of unit cells each including a photoelectric conversion section and a signal scanning circuit section on a semiconductor substrate, the each unit cell has an active region in which the photoelectric conversion section and the signal scanning circuit section are formed and an element isolating region formed adjacent to the active region, the signal scanning circuit section is composed of a plurality of MOS transistors; and wherein the plurality of MOS transistors of the signal scanning circuit section includes at least a MOS transistor having a gate contact which overlaps both of the element isolating region and the active region adjacent thereto.

18. The LSI circuit system according to claim 17, wherein the plurality of MOS transistors configures a signal scanning circuit section which includes at least an amplifier transistor which amplifies the video image signal obtained after converted by the photoelectric conversion section and a reset transistor which resets the video image signal.

19. The LSI circuit system according to claim 17, wherein the signal scanning circuit section further includes a readout transistor which reads out the video image signal obtained after converted by the photoelectric conversion section and a selector transistor which selects the amplified video image signal to be outputted to a signal line.

20. The LSI circuit system according to claim 17, wherein a voltage regulator and a JPEG circuit are included in the chip.

* * * * *